(12) United States Patent
Conley

(10) Patent No.: US 6,670,053 B2
(45) Date of Patent: Dec. 30, 2003

(54) ORGANIC ELECTROLUMINESCENT DEVICES WITH HIGH LUMINANCE

(75) Inventor: Scott R. Conley, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 73 days.

(21) Appl. No.: 10/083,031

(22) Filed: Feb. 26, 2002

(65) Prior Publication Data
US 2003/0180573 A1 Sep. 25, 2003

(51) Int. Cl.[7] .......................... H05B 33/14; C09K 11/06
(52) U.S. Cl. .................. 428/690; 428/917; 313/502; 313/504; 313/506
(58) Field of Search .................. 428/690, 917; 313/502, 504, 506

(56) References Cited

U.S. PATENT DOCUMENTS

2002/0117662 A1 * 8/2002 Nii .............................. 257/40

FOREIGN PATENT DOCUMENTS

| DE | 2204725 | * | 1/1973 |
| GB | 2347548 | * | 9/2000 |
| JP | 05-339565 | | 12/1993 |
| JP | 2001-118683 | | 4/2001 |
| JP | 2001-291590 | * | 10/2001 |

OTHER PUBLICATIONS

Journal of the American Chemical Society, Liu et al., vol. 122, web publishing date Mar. 29, 2000, pp. 3671–3678.*

* cited by examiner

Primary Examiner—Cynthia H. Kelly
Assistant Examiner—Dawn L. Garrett
(74) Attorney, Agent, or Firm—Arthur E. Kluegel

(57) ABSTRACT

Disclosed is a multilayer electroluminescent device comprising an anode, a hole transport layer (HTL), a light emitting layer (LEL), an electron transport layer (ETL), and a cathode, in that order, wherein there is located between the HTL and the LEL an interlayer (IL) comprising a compound containing a 3-phenylindolyl group.

29 Claims, 1 Drawing Sheet

ORGANIC ELECTROLUMINESCENT DEVICES WITH HIGH LUMINANCE

FIELD OF THE INVENTION

This invention relates to organic electroluminescent devices that emit light from a current-conducting organic light emitting layer and have high luminance where the device employs a particular interlayer between a hole transport layer and the light emitting layer.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium electroluminescent element sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965, Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. The organic layers in these devices, usually composed of a polycyclic aromatic hydrocarbons, were very thick (much greater than 1 $\mu$m). Consequently, operating voltages were very high, often >100V.

More recent organic EL devices include an organic EL element consisting of extremely thin layers (e.g. <1.0 $\mu$m) between the anode and the cathode. Herein, the organic "EL element" encompasses the layers between the anode and cathode electrodes. Reducing the thickness lowered the resistance of the organic layer and has enabled devices that operate much lower voltage. In a basic EL element structure, described in U.S. Pat. No. 4,356,429, one organic layer of the EL element adjacent to the anode is specifically chosen to transport holes, therefore, it is referred to as the hole transporting layer (HTL), and the other organic layer is specifically chosen to transport electrons, referred to as the electron transporting layer (ETL). The interface between the two layers provides an efficient site for the recombination of the injected hole/electron pair and the resultant electroluminescence.

There have been proposed organic EL elements that contain an organic light-emitting layer (LEL) between a hole-transporting layer and an electron-transporting layer, such as that disclosed by Tang et al [*J. Applied Physics*, Vol. 65, Pages 3610–3616, 1989]. The light-emitting layer commonly consists of a host material doped with a guest material. Still further, there has been proposed in U.S. Pat. No. 4,769,292 a four-layer EL element comprising a hole-injecting layer (HIL), a hole-transporting layer, a light-emitting layer and an electron transport/injection layer. These structures have resulted in improved device efficiency.

Materials comprising porphyrinic compounds have been disclosed by Tang in U.S. Pat. No. 4,356,429 for use in the HTL. Further improvements in device performance are taught in U.S. Pat. No. 4,539,507, U.S. Pat. No. 4,720,432, and U.S. Pat. No. 5,061,569 where the hole-transporting layer utilizes an aromatic tertiary amine.

Since these early inventions, further improvements in hole-transporting and other device materials have resulted in improved device performance in attributes such as color, stability, luminance efficiency and manufacturability, e.g., as disclosed in U.S. Pat. No. 5,061,569, U.S. Pat. No. 5,409,783, U.S. Pat. No. 5,554,450, U.S. Pat. No. 5,593,788, U.S. Pat. No. 5,683,823, U.S. Pat. No. 5,908,581, U.S. Pat. No. 5,928,802, U.S. Pat. No. 6,020,078, and U.S. Pat. No. 6,208,077, amongst others. EP 891,121 and EP 1.029,909 suggest the use of biphenylene and phenylene diamine derivatives to improve hole injecting and/or transporting and JP 11-273830 suggests the use of naphthyldiamine derivatives in EL elements generally.

In JP 2001-118,683 and in JP 05-339,565 OLED devices have been suggested that include 3-phenylindolyl groups in the HTL or the LEL. Such materials have not been suggested in an interlayer between the HTL and the LEL.

Notwithstanding the foregoing developments, there are continuing needs for organic EL device components that, at a given current, will provide a desired high luminance with little or no increase in voltage necessary to obtain the luminance.

SUMMARY OF THE INVENTION

The invention provides a multilayer electroluminescent device comprising an anode, a hole transport layer (HTL), a light emitting layer (LEL), an electron transport layer (ETL), and a cathode, in that order, wherein there is located between the HTL and the LEL an interlayer (IL) comprising a compound containing a 3-phenylindolyl group. The invention also provides an imaging device containing such an electroluminescent device.

The device of the invention produces improved luminance with little or no increase in voltage necessary to obtain the luminance.

DETAILED DESCRIPTION OF THE INVENTION

Figure 1:
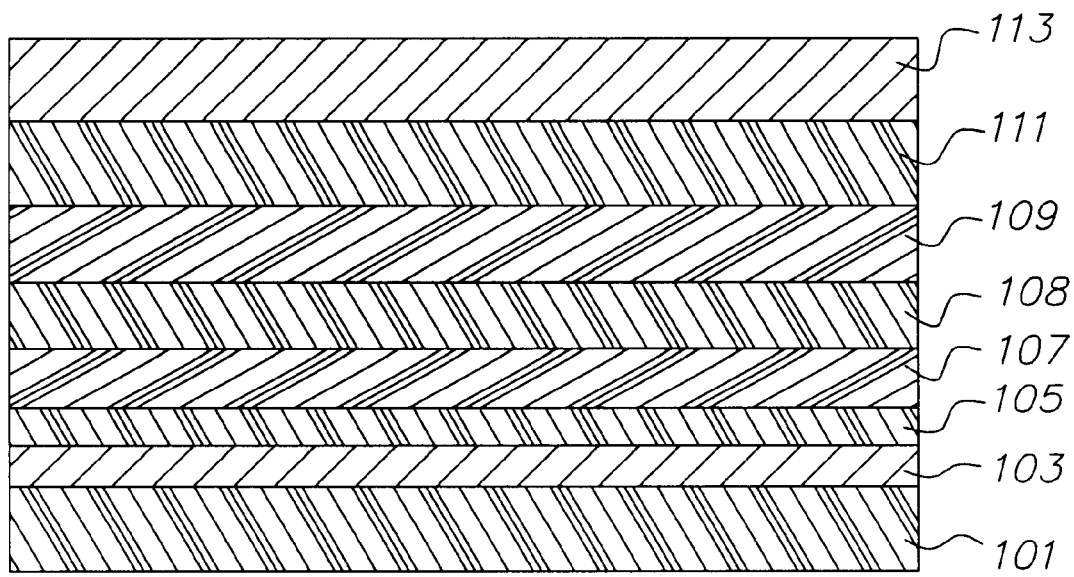
FIG. 1 is a schematic diagram showing a cross-section of a typical organic EL device of the invention containing an interlayer useful in the invention.

The EL device of the invention is generally as described above. It comprises a compound containing a 3-phenylindolyl group as illustrated in Formula F-1:

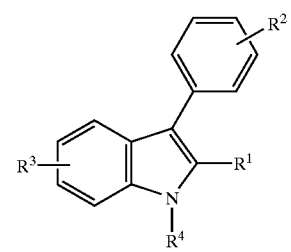

F-1 wherein $R^1$ and $R^4$ represent hydrogen, or an (cyclo)alkyl, or aromatic (carbocyclic or heterocyclic) group and $R^2$ and $R^3$ represent hydrogen or one or more optional independently selected substituents on each ring. Within the EL device the compound containing a 3-phenylindolyl group is located in an interlayer (IL) located between a hole-transporting layer and the light emitting layer, and may be in contact with one or both layers. The interlayer suitably has a thickness of from 0.1 to 90 nm, typically 0.1 to 25 nm and conveniently 0.1 to 15 nm.

Desirably, the IL will contain a compound represented by Formula F-1 wherein $R^2$ and $R^3$ may be independently selected from:

Group 1: hydrogen, an alkyl and an alkoxy group, typically of from 1 to 24 carbon atoms;

Group 2: a ring group, typically of from 5 to 20 carbon atoms;

Group 3: the atoms necessary to complete a carbocyclic fused group, typically of from 4 to 24 carbon atoms, such as an anthracenyl, pyrenyl, and perylenyl group, Group 4: the atoms necessary to complete a heterocyclic fused ring group, typically of from 5 to 24 carbon atoms, as necessary to complete a fused hetero ring such as a furyl, thienyl, pyridyl, or quinolinyl group;

Group 5: an aryloxy, alkylanino, and arylarnino group, typically of from 1 to 24 carbon atoms; and Group 6: fluorine, chlorine, bromine and cyano groups.

$R^4$ is individually selected from Groups 1, 2, 3, and 4, and $R^1$ is individually selected from Groups 1, 2, 3, 4, and 5.

More typically the IL contains a compound represented by Formula F-2:

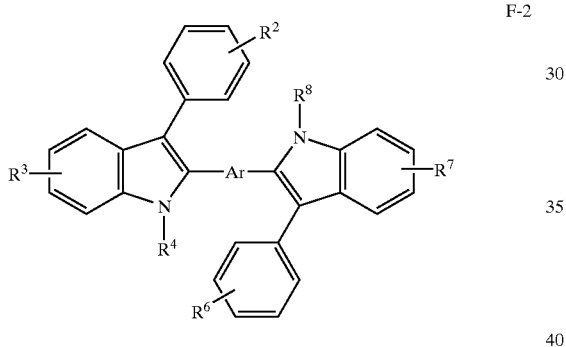

wherein $R^4$ and $R^8$ represent a substituent individually selected from Groups 1, 2, 3, and 4, and wherein $R^2$, $R^3$, $R^6$, and $R^7$ represent one or more substituents on each ring where each substituent is individually selected from the Groups 1–6 above and Ar is an aromatic group.

Illustrative examples of compounds containing a 3-phenylindolyl group useful in the present invention are the following:

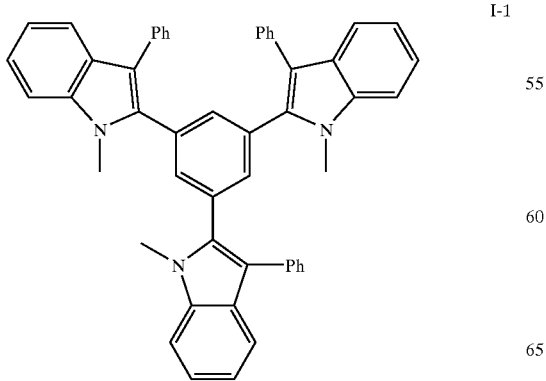

I-1

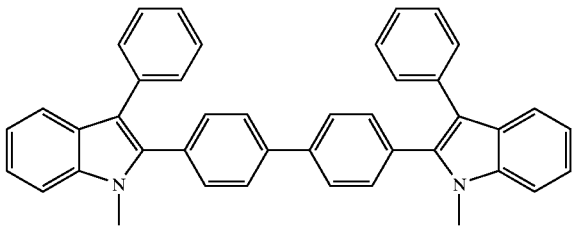

I-2

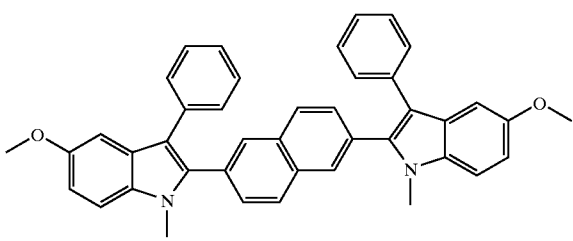

I-3

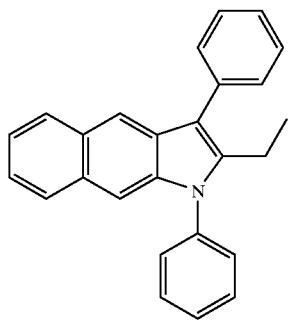

I-4

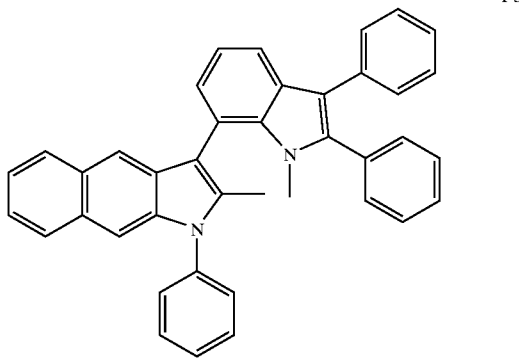

I-5

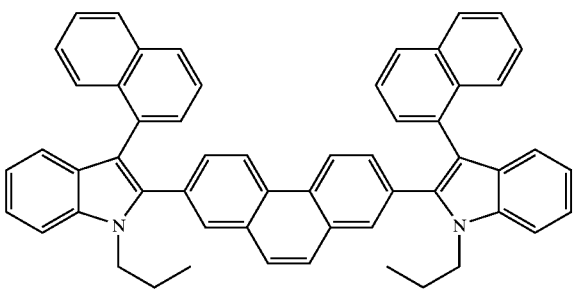

I-6

I-7
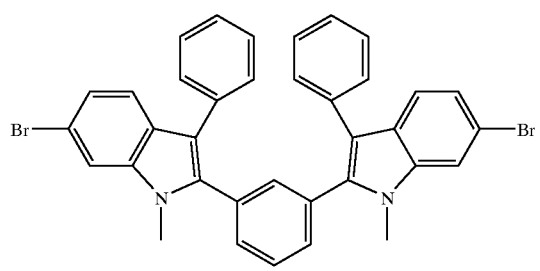

I-12
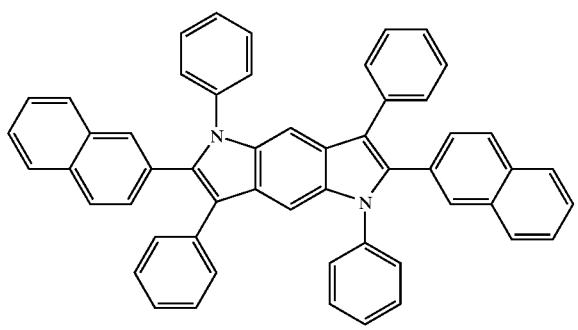

I-8
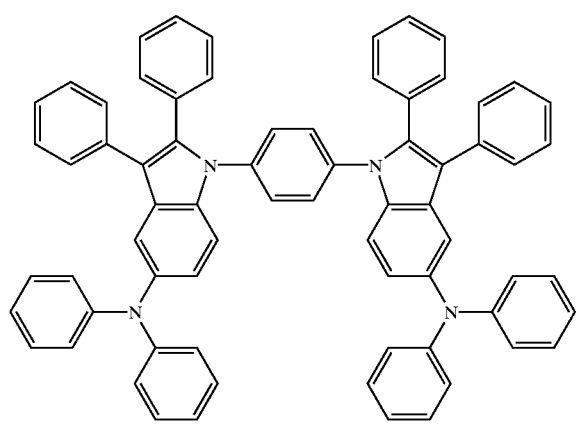

I-13
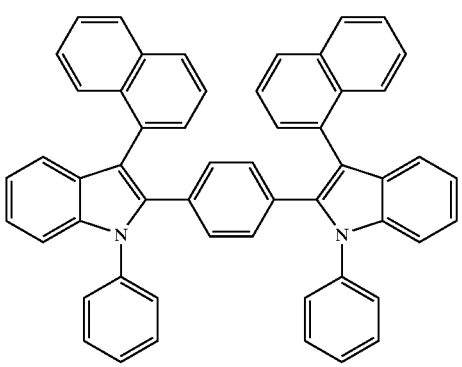

I-9
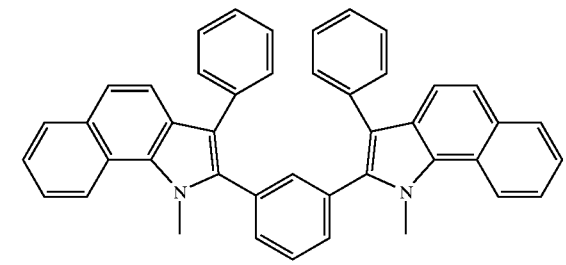

I-14
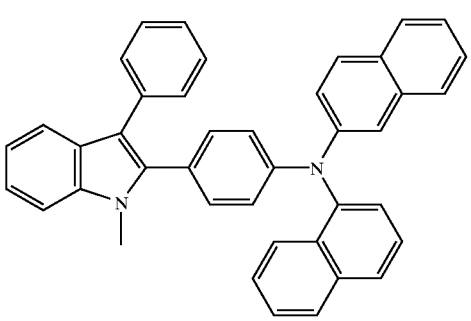

I-10
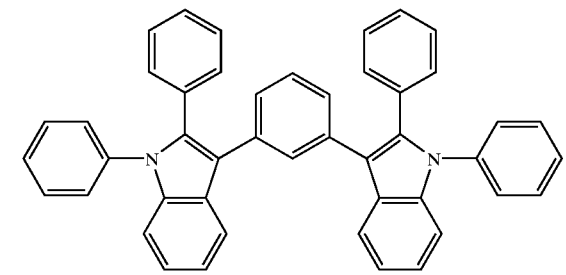

I-15
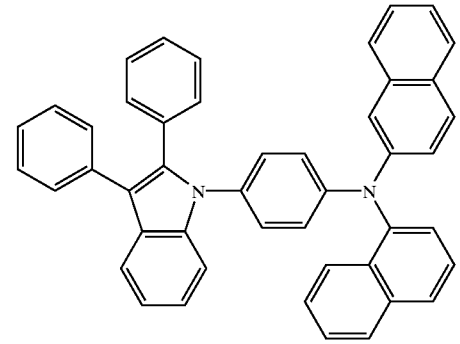

I-11
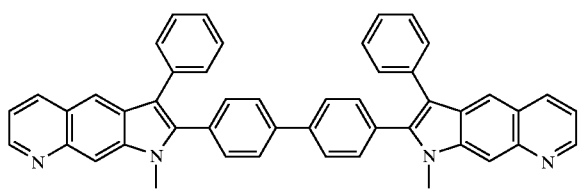

Unless otherwise specifically stated, use of the term "group", "substituted" or "substituent" means any group or atom other than hydrogen. Additionally, when reference is made in this application to a compound or group that contains a substitutable hydrogen, it is also intended to encompass not only the unsubstituted form, but also its form further substituted with any substituent group or groups as herein mentioned, so long as the substituent does not destroy properties necessary for the intended utility. Suitably, a substituent group may be halogen or may be bonded to the remainder of the molecule by an atom of carbon, silicon, oxygen, nitrogen, phosphorous, or sulfur. The substituent may be, for example, halogen, such as chlorine, bromine or fluorine, nitro, hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, cyclohexyl, and tetradecyl, alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy) ethoxy, and 2-dodecyloxyethoxy, aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy) butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl) carbonylamino, p-dodecyl-phenylcarbonylamino,p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido, sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido, sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio, acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen and sulfur, such as 2-furyl, 2-thienyl, 2-benzimidazolyloxy or 2-benzothiazolyl; quaternary ammonium, such as triethylammonium; and silyloxy, such as trimethylsilyloxy.

If desired, the substituents may themselves be further substituted one or more times with the described substituent groups. The particular substituents used may be selected by those skilled in the art to attain the desired desirable properties for a specific application. When a molecule may have two or more substituents, the substituents may be joined together to form a ring such as a fused ring unless otherwise provided.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

There are numerous configurations of the organic layers wherein the present invention can be successfully practiced. Essential requirements are a cathode, an anode, an HTL and an LEL. A more typical structure is shown in FIG. 1 and contains a substrate 101, an anode 103, an optional hole-injecting layer 105, a hole-transporting layer 107, an inter-layer 108, a light-emitting layer 109, an electron-transporting layer 111, and a cathode 113. These layers are described in detail below. Note that the substrate may alternatively be located adjacent to the cathode, or the substrate may actually constitute the anode or cathode. Also, the total combined thickness of the organic layers is preferably less than 500 nm.

Substrate

The substrate 101 can either be light transmissive or opaque, depending on the intended direction of light emission. The light transmissive property is desirable for viewing the EL emission through the substrate. Transparent glass or organic material are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course it is necessary to provide in these device configurations a light-transparent top electrode.

Anode

The conductive anode layer 103 is commonly formed over the substrate and, when EL emission is viewed through the anode, should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. For applications where EL emission is viewed through the top electrode, the transmissive characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photo-lithographic processes.

Hole-Injecting Layer (HIL)

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds such as those described in U.S. Pat. No. 4,720,432, and plasma-deposited fluorocarbon polymers such as those described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine group. Exemplary monomeric triarylamines are illustrated by Klupfel et al. U.S. Pat. No. 3,180,730. Other suitable triarylamines substituted with one or more vinyl groups and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural formula (A).

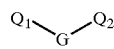

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring group, e.g., a naphthalene.

When G is an aryl group, it is conveniently a phenylene, biphenylene, or naphthalene group.

A useful class of triarylamine groups satisfying structural formula (A) and containing two triarylamine groups is represented by structural formula (B):

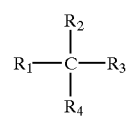

B where
$R_1$ and $R_2$ each independently represents a hydrogen atom, an aryl group, or an alkyl group or $R_1$ and $R_2$ together represent the atoms completing a cycloalkyl group; and
$R_3$ and $R_4$ each independently represents an aryl group, which is in turn substituted with a diaryl substituted amino group, as indicated by structural formula (C):

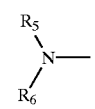

C wherein $R_5$ and $R_6$ are independently selected aryl groups. In one embodiment, at least one of $R_5$ or $R_6$ contains a polycyclic fused ring group, e.g., a naphthalene.

Another class of aromatic tertiary amine groups are the tetraaryldiamines. Desirable tetraaiyldiamines groups include two diarylamino groups, such as indicated by formula (C), linked through an arylene group. Useful tetraaryldiamines include those represented by formula (D).

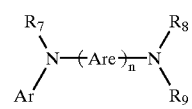

D wherein
each Are is an independently selected arylene group, such as a phenylene or anthracene group,
n is an integer of from 1 to 4, and
Ar, $R_7$, $R_8$, and $R_9$ are independently selected aryl groups. In a typical embodiment, at least one of Ar, $R_7$, $R_8$, and $R_9$ is a polycyclic fused ring group, e.g., a naphthalene.

The various alkyl, alkylene, aryl, and arylene groups of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene groups typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene groups are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4—4'-diaminobiphenyl
N,N,N',N'-Tetraphenyl-4,4'-diaminobiphenyl
N,N,N',N'-tetra-1-naphthyl-4,4 '-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4'-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorine
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. No. 4,769,292 and 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. No. 4,768,292, U.S. Pat. No. 5,141,671, U.S. Pat. No. 5,150,006, U.S. Pat. No. 5,151,629, U.S. Pat. No. 5,405,709, U.S. Pat. No. 5,484,922, U.S. Pat. No. 5,593,788, U.S. Pat. No. 5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

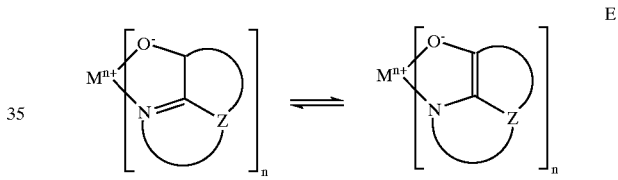

E wherein

M represents a metal, n is an integer of from 1 to 4, and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(II)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

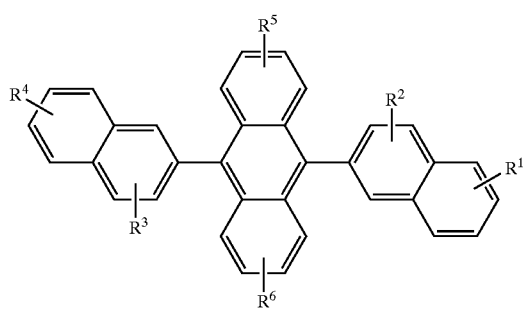

F wherein: $R^1$, $R^2$, $R^3$, $R^4$, $R^5$, and $R^6$ represent hydrogen or one or more substituents selected from the following groups:

Group 1: hydrogen, alkyl and alkoxy groups typically having from 1 to 24 carbon atoms;

Group 2: a ring group, typically having from 6 to 20 carbon atoms,

Group 3: the atoms necessary to complete a carbocyclic fused ring group such as naphthyl, anthracenyl, pyrenyl, and perylenyl groups, typically having from 6 to 30 carbon atoms, Group 4: the atoms necessary to complete a heterocyclic fused ring group such as furyl, thienyl, pyridyl, and quinolinyl groups, typically having from 5 to 24 carbon atoms;

Group 5: an aryloxy, alkylamino, and arylamino group typically having from 1 to 24 carbon atoms; and Group 6: fluorine, chlorine, bromine and cyano groups.

Illustrative examples include 9,10-di-(2-naphthyl) anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Benzazole derivatives (Formula G) constitute another class of useful hosts capable of supporting electroluminescence, and are particularly suitable for light emission of wavelengths longer than 400 nm, e.g., blue, green, yellow, orange or red.

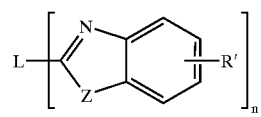

G where:

n is an integer of 3 to 8;

Z is —O, —NR or —S where R is H or a substituent; and

R' represents one or more optional substituents where R and each R' are H or alkyl groups such as propyl, t-butyl, and heptyl groups typically having from 1 to 24 carbon atoms, carbocyclic or heterocyclic ring groups such as phenyl and naphthyl, furyl, thienyl, pyridyl, and quinolinyl groups and atoms necessary to complete a fused aromatic ring group typically having from 5 to 20 carbon atoms; and halo such as chloro, and fluoro;

L is a linkage unit usually comprising an alkyl or aryl group which conjugately or unconjugately connects the multiple benzazoles together.

An example of a useful benzazole is 2,2', 2"-(1,3,5-phenylene)tris[1-phenyl-1H-benzimidazole].

Desirable fluorescent dopants include groups derived from fused ring, heterocyclic and other compounds such as anthracene, tetracene, xanthene, perylene, rubrene, coumarin, rhodamine, quinacridone, dicyanomethylenepyran, thiopyran, polymethine, pyrilium thiapyrilium, and carbostyryl compounds. Illustrative examples of useful dopants include, but are not limited to, the following:

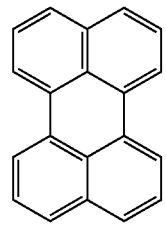

L1

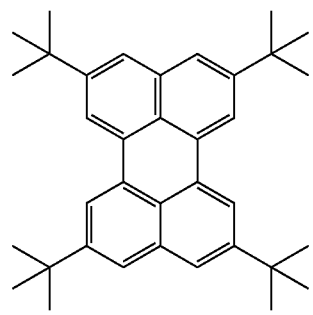

L2

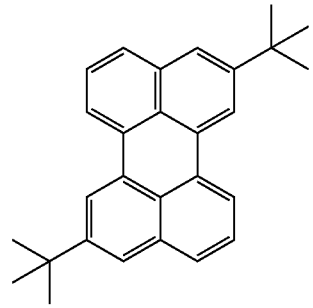

L3

-continued

L4
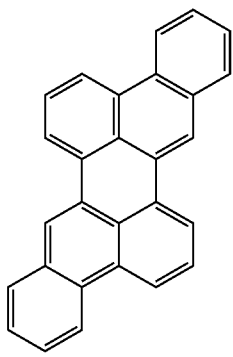

L5
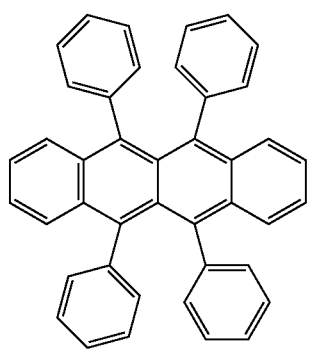

L6
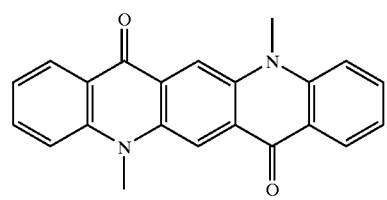

L7
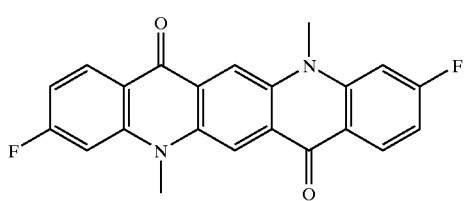

L8
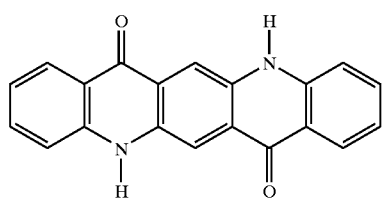

| | X | R1 | R2 |
|---|---|---|---|

-continued

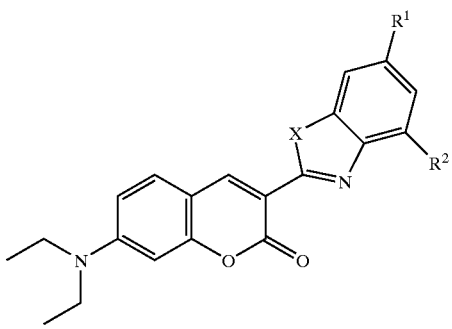

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

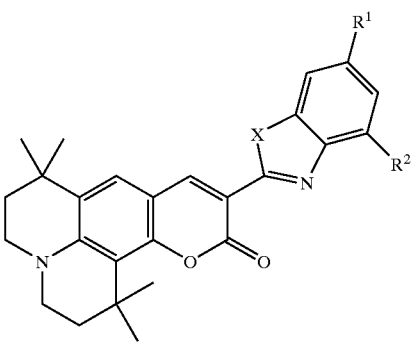

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

R

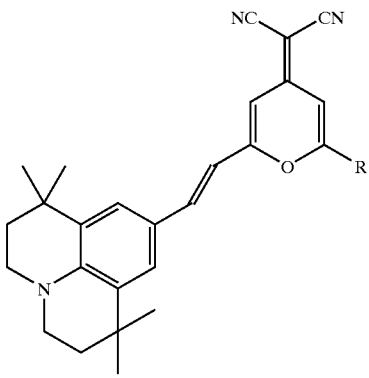

| L37 | phenyl |
| L38 | methyl |
| L39 | t-butyl |
| L40 | mesityl |

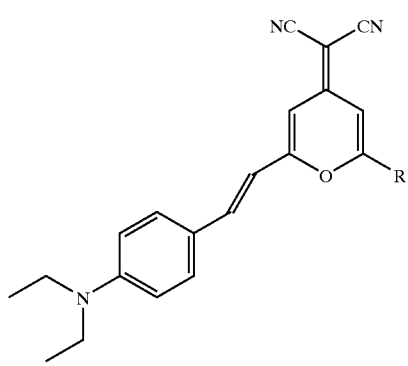

| L41 | phenyl |
| L42 | methyl |
| L43 | t-butyl |
| L44 | mesityl |

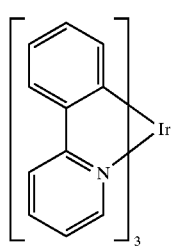

L45

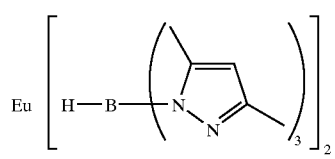

L46

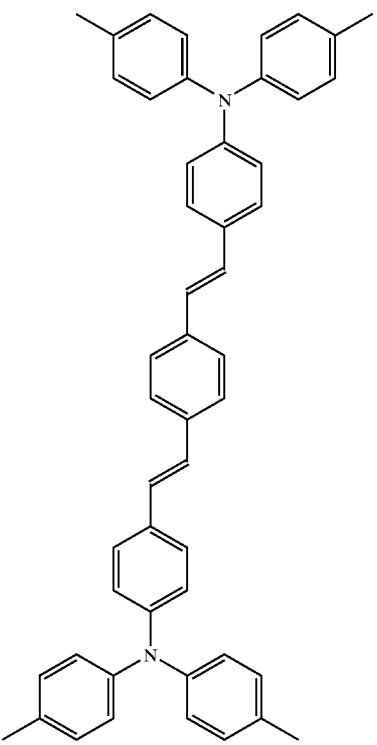

L47

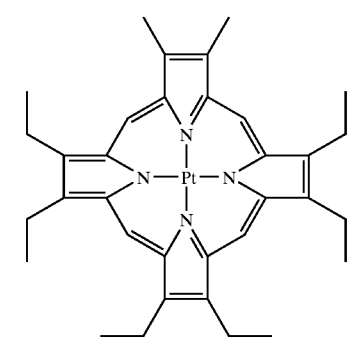

L48

Electron-Transporting Layer (ETL)

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials.

In some instances, layers 109 and 111 can optionally be collapsed into a single layer that serves the function of supporting both light emission and electron transportation.

Cathode

When light emission is through the anode, the cathode layer 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. No. 5,059,861, U.S. Pat. No. 5,059,862, and U.S. Pat. No. 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,851,709 and U.S. Pat. No. 6,066,357) and inkjet method (U.S. Pat. No. 6,066,357).

Encapsulation

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

EXAMPLES

Synthesis

Preparation of I-1. 1,3,5-tricarbonylphenyl trichloride (10.9 g, 40.9 mmol) was added to a mixture of 2-aminobenzophenone (25 g, 127 mmol) and triethyl amine (20.5 mL, 147 mmol) in methylene chloride (400 mL) at 0° C. The mixture was stirred overnight at room temperature. HCl (1 M, 100 mL) was added and the solid was filtered to yield Compound S-1.

Titanium trichloride (0.43 g, 2.81 mmol), ziric (9.2 g, 14 mmol), and trimethylsilyl chloride (17.8 mL, 14 mmol) was added to a mixture of amide S-1 (7.0 g, 9.36 mmol) in 1,2-dimethoxyethane (93 mL). The mixture was heated to 110° C. for 8 hours, then cooled to room temperature. The mixture was filtered through a pad of silica gel with methylene chloride. The filtrate was concentrated with a rotary evaporator and recrystallized from ethyl acetate and heptane to yield S-2.

Sodium hydride (1.1 g, 60%, 26.9 mmol) was added to a mixture of indole S-2 (3.5 g, 5.37 mmol) in tetrahydrofuran (55 mL) at 0° C. After stirring for 1 hour at room temperature, methyl iodide (1.3 mL, 21.5 mmol) was added. After stirring overnight a saturated solution of ammonium chloride (40 mL) was added. The mixture was extracted with ethyl acetate, dried with magnesium sulfate. The mixture was filtered and the filtrate concentrated with a rotary evaporator and recrystallized from ethyl acetate and heptane to yield I-1.

Scheme 1

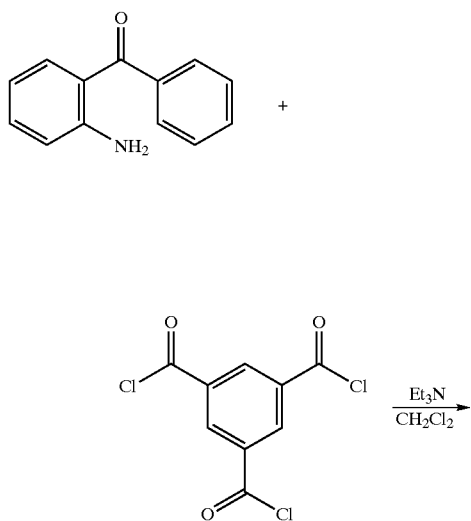

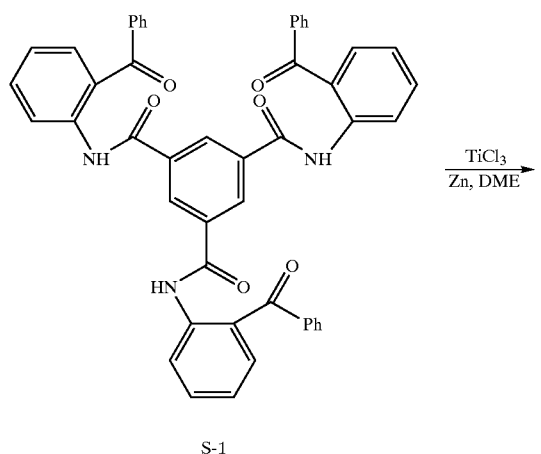

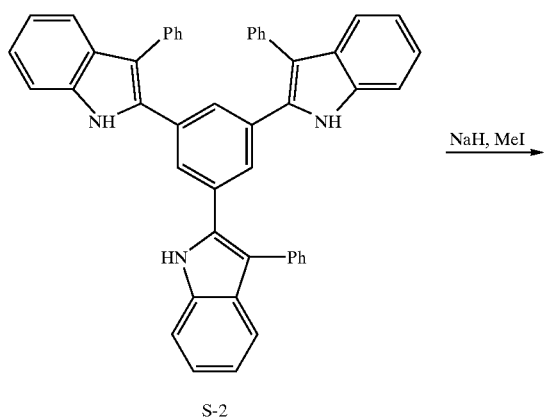

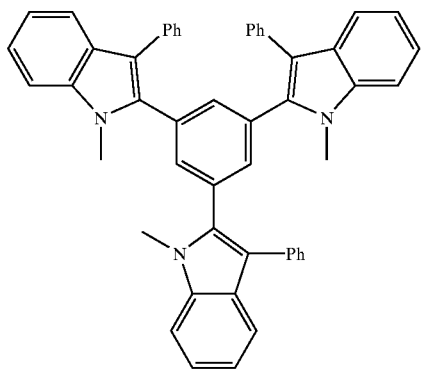

I-1

Device Examples

EL Device Fabrication and Performance

A series of EL devices satisfying the requirements of the invention were constructed in the following manner:

A glass substrate coated with an 42 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO anode was deposited a 1 nm fluorocarbon hole-injecting layer (CFx) by plasma-assisted deposition of $CHF_3$.

b) A hole-transporting layer of N,N'-di-1-naphthalenyl-N, N'-diphenyl-4,4'-diaminobiphenyl (NPB, see Table 1 for layer thickness), was then deposited over the CFx by evaporation from a tantalum boat.

c) A layer of Compound I-1 (see Table 1 for layer thickness) was then deposited onto the hole-transporting layer by evaporation from a tantalum boat to form the invention interlayer.

d) A 75 nm light-emitting/electron transport layer of tris(8-quinolinolato)aluminum (III) ($AlQ_3$) was then deposited onto the interlayer. This material was also evaporated from a tantalum boat.

e) On top of the $AlQ_3$ layer was deposited a 220 nm cathode formed of a 10:1 atomic ratio of Mg and Ag.

A comparison device was prepared omitting layer c) and containing an overall device layer thickness substantially the same as the other examples.

The cells thus formed were tested for luminance with a constant current of 20 mA/cm$^2$ and the results are reported in Table I. It can be seen from Table I that the compounds useful in the invention, when incorporated into EL cells, give an increase in luminance of 20–34% compared to the check comparison while in any cases also gives a desirable decrease in voltage.

TABLE I

Evaluation Results for Compound 1.

| Example | Type | HTL Layer b) Comp NPB Thickness (nm) | IL Layer c) Comp I-1 Thickness (nm) | Cell Luminance (candela/m²) | Relative Luminance (%) | Cell Voltage (V) | Relative Voltage (%) |
|---|---|---|---|---|---|---|---|
| 3-1 | Comp | 75.0 | 0.0 | 629 | 100 | 7.6 | 100 |
| 3-2 | Inv | 70.3 | 2.5 | 841 | 134 | 7.0 | 92 |
| 3-3 | Inv | 70.0 | 5.0 | 833 | 132 | 7.2 | 94 |
| 3-4 | Inv | 67.5 | 7.5 | 825 | 131 | 7.5 | 99 |
| 3-5 | Inv | 65.0 | 10.0 | 798 | 127 | 7.6 | 100 |
| 3-6 | Inv | 60.0 | 15.0 | 761 | 120 | 7.9 | 104 |
| 3-7 | Comp | 0.0 | 75.0 | 791 | 126 | 11.6 | 153 |

As can be seen from the data, the inventive samples provide an improved luminance over the corresponding comparison samples. Sample 3-1 represents a HTL of NPB only and Sample 3-7 represents a HTL containing I-1 only. It is noted that the use of I-1 in the HTL improves the luminance vs. NPB, but at an extreme penalty for voltage requires. On the other hand, when the I-1 compound is provided as a separate interlayer between the NPB HTL and the LEL, the inventive devices exhibit improved relative luminance with little or no increase in voltage requirement.

The invention has been described in detail with particular reference to certain preferred embodiments thereof, but it will be understood that variations and modifications can be effected within the scope of the invention. The entire contents of the patents and other publications referred to in this specification are incorporated herein by reference.

PARTS LIST

101 Substrate
103 Anode
105 Hole-Injecting layer (HIL)
107 Hole-Transporting layer (HTL)
108 Interlayer (IL)
109 Light-Emitting layer (LEL)
111 Electron-Transporting layer (ETL)
113 Cathode

What is claimed is:

1. A multilayer electroluminescent device comprising an anode, a hole transport layer (HTL), a light emitting layer (LEL), an electron transport layer (ETL), and a cathode, in that order, wherein there is located between the HTL and the LEL an interlayer (IL) comprising a compound containing a 3-phenylindolyl group.

2. The device of claim 1 wherein the IL is contiguous with the HTL and the LEL.

3. The device of claim 1 wherein the IL is between 0.1 and 90 nm thick.

4. The device of claim 3 wherein the IL is between 0.1 and 25 nm thick.

5. The device of claim 4 wherein the IL is between 0.1 and 15 nm thick.

6. The device of claim 1 wherein the LEL contains tris(8-quinolinolato)aluminum(III).

7. The device of claim 1 wherein the HTL contains an aromatic tertiary amine group containing at least one trivalent nitrogen atom that is bonded only to carbon atoms, at least one of which is a member of an aromatic ring group.

8. The device of claim 1 wherein the LEL contains a dopant in an amount of 0.01 to 20% by weight.

9. The device of claim 1 wherein the ETL contains tris(8-quinolinolato)aluminum(III).

10. The device of claim 1 wherein the LEL contains a compound having the formula:

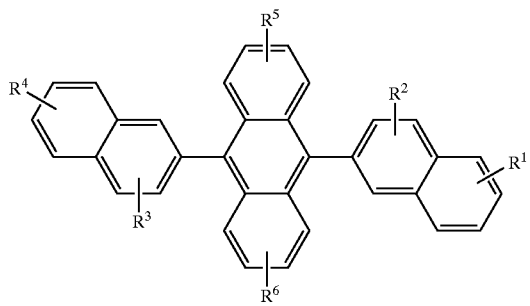

wherein: $R^1$, $R^2$, $R^3$, $R^4$, $R^5$, and $R^6$ represent hydrogen or one or more substituents on the ring to which it is attached selected from the following groups:

Group 1: H and an alkyl or alkoxy group;

Group 2: a ring group;

Group 3: the atoms necessary to complete a carbocyclic fused ring group;

Group 4: the atoms necessary to complete a heterocyclic fused ring group;

Group 5: an alkoxyamino, alkylamino, and arylamino group; and

Group 6: fluorine, chlorine, bromine and cyano groups.

11. The device of claim 10 wherein the LEL contains a dopant in an amount of 0.01 to 20% by weight.

12. The device of claim 1 wherein the LEL contains a compound having formula I:

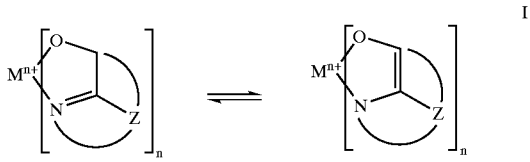

wherein

M represents a metal;

n is an integer of from 1 to 3; and

Z independently in each occurrence represents the atoms completing a nucleus having at least two fused aromatic rings.

13. The device of claim 1 wherein the LEL contains a compound that fluoresces with the color red.

14. The device of claim 1 wherein the 3-phenylindolyl group is represented by Formula (F-1):

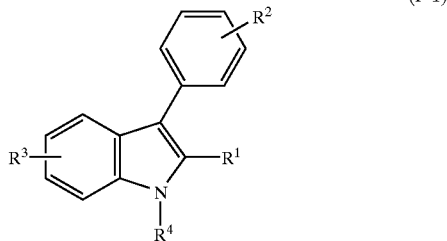

(F-1)

wherein $R^1$ and $R^4$ represent a substituent and wherein $R^2$ and $R^3$ represent H or one or more optional substituents on each ring, where each substituent is independently selected from the group consisting of H and alkyl or alkoxy groups; ring groups of from 5 to 20 carbon atoms; atoms necessary to complete a carbocyclic fused ring group; atoms necessary to complete a heterocyclic fused ring group, aryloxy, alkylamino, and arylamino groups; and fluorine, chlorine, bromine and cyano groups.

15. The device of claim 14 wherein $R^4$ is selected from the group consisting of H, alkyl and alkoxy groups of from 1 to 24 carbon atoms; ring groups of from 5 to 20 carbon atoms, atoms necessary to complete a carbocyclic fused ring group; atoms necessary to complete a heterocyclic fused ring group, and an aryloxy, alkylamino, and arylamino group of from 1 to 24 carbon atoms.

16. The device of claim 14 wherein $R^1$ is selected from the group consisting of H, alkyl and alkoxy groups of from 1 to 24 carbon atoms, ring groups of from 5 to 20 carbon atoms; atoms necessary to complete a carbocyclic fused ring group; atoms necessary to complete a heterocyclic fused ring group; and an aryloxy, alkylamino, and arylamino group of from 1 to 24 carbon atoms.

17. The device of claim 14 wherein $R^1$ is an aromatic group of from 5 to 20 carbon atoms.

18. The device of claim 14 wherein $R^1$ is represented by Formula II:

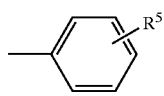

II wherein $R^5$ represents one or more substituents on the aromatic ring where each is independently selected from the group consisting of following groups:

Group 1: hydrogen, alkyl and alkoxy groups of from 1 to 24 carbon atoms;

Group 2: ring groups of from 5 to 20 carbon atoms;

Group 3: atoms necessary to complete a fused carbocyclic ring of from 4 to 24 carbon atoms Group 4: atoms necessary to complete a fused heterocyclic ring of from 5 to 24 carbon atoms.

19. The device of claim 14 wherein $R^4$ is a methyl group.

20. The device of claim 14 wherein $R^2$ represents the atoms necessary to complete a fused ring.

21. The device of claim 14 wherein $R^3$ represents the atoms necessary to complete a fused ring.

22. The device of claim 18 wherein $R^5$ is an aromatic group of from 5 to 20 carbon atoms.

23. The device of claim 1 wherein the compound contains at least two 3-phenylindolyl groups as represented by Formula F-2:

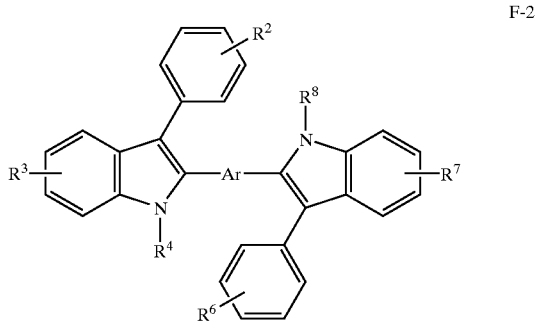

F-2 wherein $R^4$ and $R^8$ represent a substituent and wherein $R^2$, $R^3$, $R^6$, and $R^7$ represent one or more substituents on each ring where each substituent is individually selected from the following groups:

Group 1: H and an alkyl or alkoxy group;

Group 2: a ring group;

Group 3: the atoms necessary to complete a carbocyclic fused ring group;

Group 4: the atoms necessary to complete a heterocyclic fused ring group;

Group 5: an aryloxy, alkylamino, and arylamino group; and

Group 6: fluorine, chlorine, bromine and cyano groups;

wherein Ar is an aromatic group.

24. The device of claim 23 wherein $R^4$ and $R^8$ are independently selected from Groups 1, 2, 3, and 4.

25. The device of claim 23 wherein Ar is a para-substituted phenyl group.

26. The device of claim 23 wherein Ar is a 4,4'-substituted biphenyl group.

27. The device of claim 23 wherein Ar is a 1,3,5-trisubstituted phenyl group, wherein each of the substituents is a 3-phenylindolyl group.

28. A multilayer electroluminescent device of claim 1 wherein the compound containing a 3-phenylindolyl group contains at least two 3-phenylindolyl groups.

29. A static or motion imaging device incorporating the device of claim 1.

* * * * *